(12) United States Patent
Liu et al.

(10) Patent No.: US 9,263,569 B2
(45) Date of Patent: Feb. 16, 2016

(54) MISFET DEVICE AND METHOD OF FORMING THE SAME

(71) Applicant: Taiwan Semiconductor Manufacturing Company, Ltd., Hsin-Chu (TW)

(72) Inventors: Sheng-De Liu, Zhongli (TW); Ming-Chyi Liu, Hsin-Chu (TW); Chung-Yen Chou, Hsin-Chu (TW); Chia-Shiung Tsai, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/959,028

(22) Filed: Aug. 5, 2013

(65) Prior Publication Data

US 2015/0035021 A1  Feb. 5, 2015

(51) Int. Cl.
  *H01L 29/78* (2006.01)
  *H01L 29/66* (2006.01)
  *H01L 29/778* (2006.01)
  *H01L 21/338* (2006.01)

(52) U.S. Cl.
  CPC .......... *H01L 29/78* (2013.01); *H01L 29/66568* (2013.01)

(58) Field of Classification Search
  CPC .............. H01L 29/7827; H01L 29/66431; H01L 29/4236; H01L 29/402; H01L 29/42376; H01L 29/66462; H01L 29/7783; H01L 29/42368

USPC ........... 438/183, 199, 172, 182; 257/288, 76, 257/615, 192, 256, 284

See application file for complete search history.

(56) References Cited

U.S. PATENT DOCUMENTS

| | | | | |
|---|---|---|---|---|
| 2007/0018199 | A1* | 1/2007 | Sheppard et al. | 257/200 |
| 2007/0164322 | A1* | 7/2007 | Smith et al. | 257/256 |
| 2011/0032964 | A1* | 2/2011 | Sauer et al. | 372/43.01 |
| 2011/0254015 | A1* | 10/2011 | Doris et al. | 257/77 |
| 2011/0278697 | A1* | 11/2011 | Tan et al. | 257/532 |
| 2012/0223394 | A1* | 9/2012 | Toh et al. | 257/384 |
| 2012/0329276 | A1* | 12/2012 | Maekawa et al. | 438/667 |
| 2013/0020718 | A1* | 1/2013 | Chou | 257/774 |
| 2013/0178024 | A1* | 7/2013 | Flachowsky et al. | 438/199 |
| 2015/0021662 | A1* | 1/2015 | Basu et al. | 257/192 |

* cited by examiner

*Primary Examiner* — Kimberly Rizkallah
*Assistant Examiner* — Brian Turner
(74) *Attorney, Agent, or Firm* — Slater & Matsil, L.L.P.

(57) ABSTRACT

Embodiments of the present disclosure include a method for forming a semiconductor device, a method for forming a MISFET device, and a MISFET device. An embodiment is a method for forming a semiconductor device, the method including forming a source/drain over a substrate, forming a first etch stop layer on the source/drain, and forming a gate dielectric layer on the first etch stop layer and along the substrate. The method further includes forming a gate electrode on the gate dielectric layer, forming a second etch stop layer on the gate electrode, and removing the gate dielectric layer from over the source/drain.

20 Claims, 5 Drawing Sheets

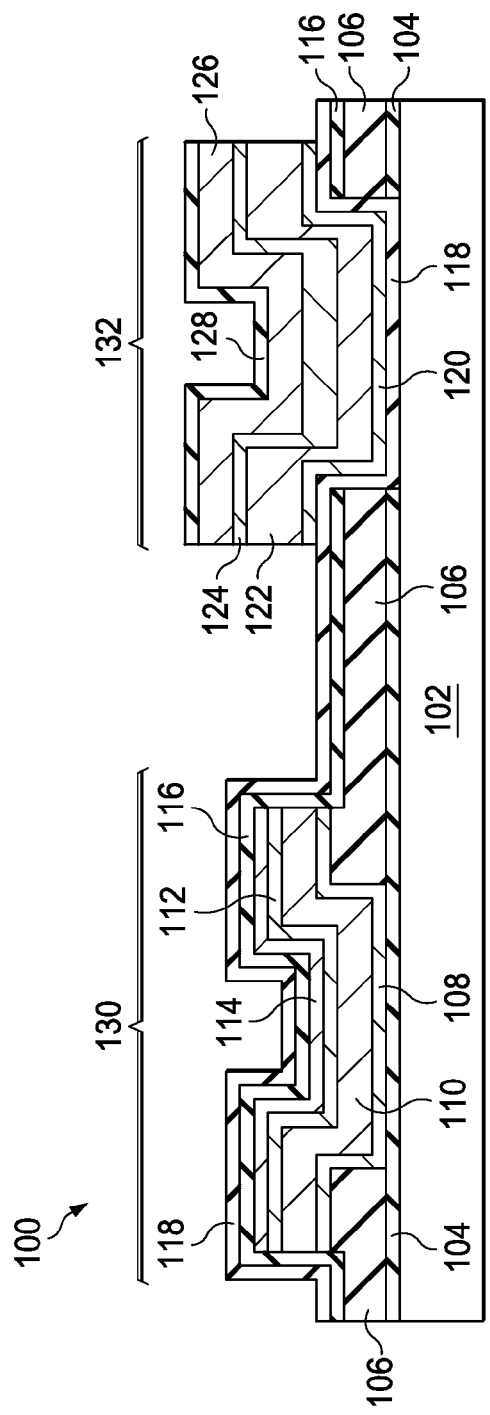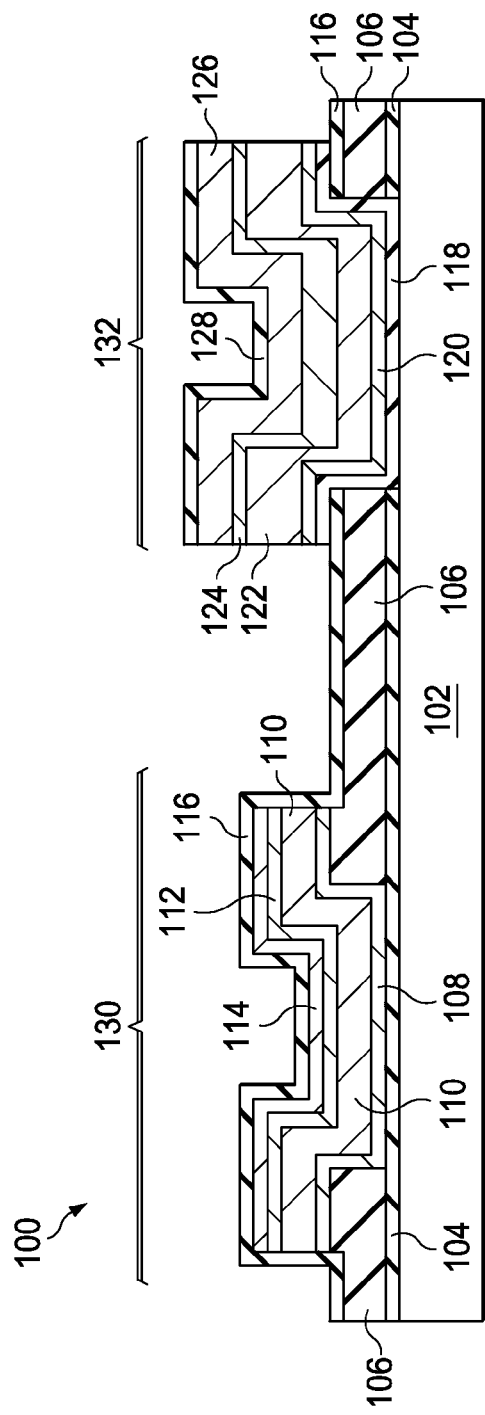

MISFET DEVICE AND METHOD OF FORMING THE SAME

BACKGROUND

While the scaling down of the device feature size in a semiconductor integrated circuit (IC) continues in the pursuit of smaller, faster, and more complex circuit functions on a single integrated circuit, maintaining high drive current at scaled voltages and smaller metal-insulator-semiconductor field-effect transistor (MISFET) gate dimensions generally becomes more important. Device drive current is closely related to parameters such as gate dimension, gate capacitance, and carrier mobility. Among the various technology innovations made to maintain high MISFET drive current, high-k (dielectric constant) gate dielectrics and metal gate electrodes are commonly adopted to increase gate capacitance of MISFETs in advanced technology.

Silicon oxide ($SiO_2$) is widely used as gate dielectric layer for MISFETs. However, device feature size scaling in advanced technology may lead to a very thin gate $SiO_2$ layer and, thus, the gate leakage current may become unacceptably large. High-k gate dielectrics may be used to replace $SiO_2$ (k=3.9) gate dielectric in a sense that high-k gate dielectrics provide a thicker gate dielectric layer and hence leak less, while being able to maintain a desired large gate capacitance and thus a large device drive current. Drive current performance also may be improved through the use of metal gates. Compared to a conventional polysilicon (poly) gate, the use of metal gates tends to increase device drive current by eliminating the poly depletion effect.

BRIEF DESCRIPTION OF THE DRAWINGS

For a more complete understanding of the present embodiments, and the advantages thereof, reference is now made to the following descriptions taken in conjunction with the accompanying drawings, in which:

FIG. 2A through 2G illustrate cross-sectional views of intermediate stages in the manufacturing of a semiconductor device according to an embodiment.

DETAILED DESCRIPTION OF ILLUSTRATIVE EMBODIMENTS

Figure 1:
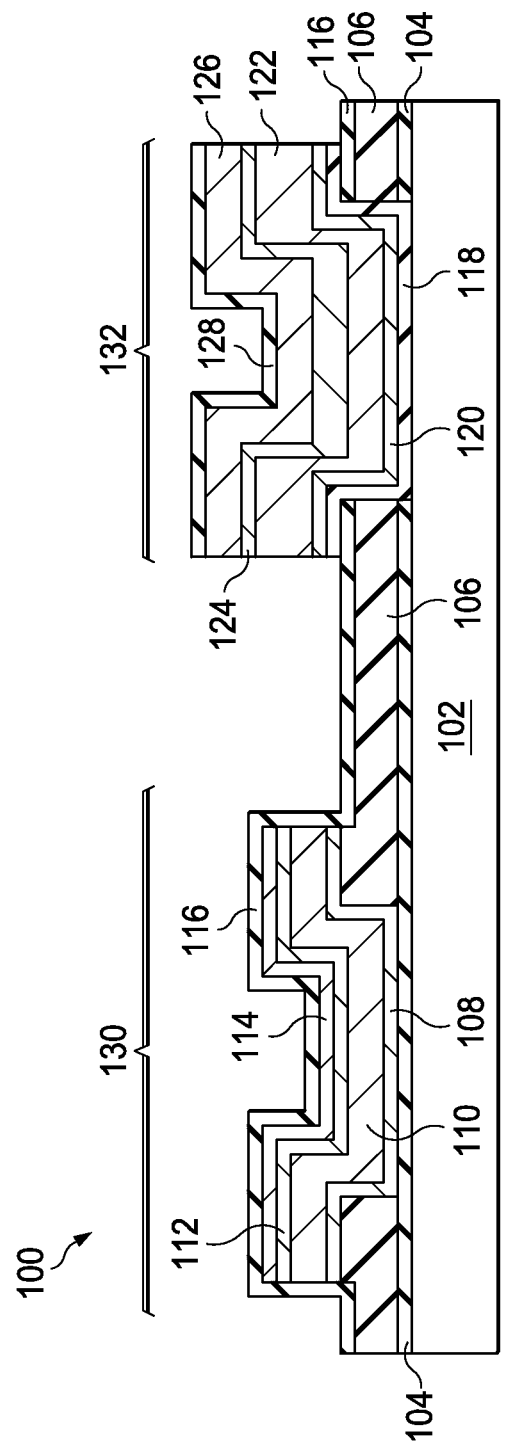
FIG. 1 illustrates a semiconductor device according to an embodiment.

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Embodiments will be described with respect to a specific context, namely a metal-insulator-semiconductor field-effect transistor (MISFET) device with a stacked gate structure. Other embodiments may also be applied, however, to other devices with a stacked gate structure.

With reference now to FIG. 1, there is shown a semiconductor device 100 including a substrate 102, a barrier layer 104 on the substrate 102, a source/drain 130 on the barrier layer 104, and a gate electrode 132 extending through the barrier layer 104 on the substrate 102. The semiconductor device 100 illustrated in FIG. 1 is a metal-insulator-oxide field-effect transistor (MISFET) and will be referred to as a MISFET 100 hereinafter. The MISFET 100 further includes a cap layer 106 on the barrier layer 104. The source/drain 130 is formed on the barrier layer 104 such that the source/drain 130 extends through the cap layer 106. In an embodiment, the source/drain 130 includes several stacked source/drain conductive layers 108, 110, 112, and 114 formed in an opening of the cap layer 106. In some embodiments, each of the stacked source/drain conductive layers 108, 110, 112, and 114 contains a metal. After the stacked source/drain conductive layers 108, 110, 112, and 114 of the source/drain 130 are formed, an etch stop layer (ESL) 116 is formed over the stacked source/drain conductive layers 108, 110, 112, and 114 and over the cap layer 106. The gate electrode 132 is formed in an opening on the substrate 102 such that the gate electrode 132 extends through the ESL 116, the cap layer 106, and the barrier layer 104. In an embodiment, the gate electrode 132 includes several stacked gate conductive layers 120, 122, 124, and 126. In some embodiments, each of the stacked gate conductive layers 120, 122, 124, and 126 contains a metal. After the stacked gate conductive layers 120, 122, 124, and 126 of the gate electrode are formed, an ESL 128 is formed over the stacked gate conductive layers 120, 122, 124, and 126. In some embodiments, the ESL 116 and the ESL 128 have a same material composition. By forming the ESL 116 and the ESL 128 of a same material composition, the process window for etching contacts (e.g. contacts 142 and 144 in FIG. 2G) to the source/drain 130 and the gate electrode 132 is enlarged. The enlarged contact etch process window will improve the yield of the MISFET 100 as the ESL 128 protects the top conductive layer 126 of the gate electrode 132 from damage by contact etch process.

The substrate 102 may be made of a semiconductor material such as silicon, germanium, diamond, sapphire, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 102 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof.

In some embodiments, the substrate 102 includes a heterojunction formed between two different semiconductor material layers (not shown in FIG. 1), such as material layers with different band gaps. For example, the substrate 102 includes a non-doped narrow-band gap channel layer and a wide-band gap donor-supply layer. These layers may be formed of from the III-V groups in the periodic table of elements. In an embodiment, the channel layer and the donor-supply layer have a different material composition. In a specific embodiment, the channel layer includes a gallium nitride (GaN) layer and the donor-supply layer includes an aluminum gallium nitride (AlGaN) layer.

The substrate 102 may include active and passive devices (not shown in FIG. 1). As one of ordinary skill in the art will recognize, a wide variety of devices such as transistors, capacitors, resistors, combinations of these, and the like may be used to generate the structural and functional requirements of the semiconductor device. The devices may be formed using any suitable methods. Only a portion of the substrate 102 is illustrated in the figures, as this is sufficient to fully describe the illustrative embodiments.

The substrate 102 may also include metallization layers (not shown). The metallization layers may be formed over the active and passive devices and are designed to connect the various devices to form functional circuitry. The metallization layers may be formed of alternating layers of dielectric (e.g., low-k dielectric material) and conductive material (e.g., copper) and may be formed through any suitable process (such as deposition, damascene, dual damascene, or the like).

The barrier layer 104 is formed over the substrate 102. In some embodiments, the barrier layer 104 is formed of AlGaN, aluminum gallium arsenic (AlGaAs), aluminum indium phosphorous (AlInP), the like, or a combination thereof. The barrier layer 104 is epitaxially grown on the substrate 102 using chemical vapor deposition (CVD), atomic layer deposition (ALD), the like, or a combination thereof. In an embodiment with an AlGaN barrier layer 104, the AlGaN barrier layer 104 is epitaxially grown on the substrate 102 by metal organic vapor phase epitaxy (MOVPE) using an aluminum-containing precursor, a gallium-containing precursor, and a nitrogen-containing precursor. The aluminum-containing precursor may include trimethylaluminum (TMA), tri-ethylaluminium (TEA), the like, or a combination thereof. The gallium-containing precursor may include trimethylgallium (TMG), triethylgallium (TEG), the like, or a combination thereof. The nitrogen-containing precursor may include ammonia, tertiarybutylamine (TBAm), phenyl hydrazine, the like, or a combination thereof. In an embodiment, the barrier layer 104 has a thickness in a range from about 5 nanometers to about 50 nanometers.

After the barrier layer 104 is formed, the cap layer 106 is formed on the barrier layer 104. The cap layer 106 protects the barrier layer 104 from damage from subsequent processes such as processes including plasma. In some embodiments, the barrier layer 104 is formed of silicon nitride, silicon oxide, the like, or a combination thereof. In an embodiment with a silicon nitride cap layer 106, the silicon nitride cap layer 106 is formed using a low pressure CVD (LPCVD) process. In some embodiments, the LPCVD process is performed at a temperature from about 600° C. to about 850° C., at a pressure from about 0.1 Torr to about 1 Torr, and with process gases including $SiH_4$, $NH_3$, the like, or a combination thereof.

After the cap layer 106 is formed, an opening (not shown) is formed through the cap layer 106 to expose a top surface of the barrier layer 104. After the opening is formed through the cap layer 106, a source/drain 130 is formed in the opening. In some embodiments, the source/drain 130 includes more than one stacked source/drain conductive layers 108, 110, 112, and 114. The first source/drain conductive layer 108 is formed in the opening and over the barrier layer 104. The second source/drain conductive layer 110 is formed on the first source/drain conductive layer 108, the third source/drain conductive layer 112 is formed on the second source/drain conductive layer 110, and the fourth source/drain conductive layer 114 is formed on the third source/drain conductive layer 112. The source/drain conductive layers 108, 110, 112, and 114 are formed of titanium (Ti), titanium nitride (TiN), aluminum (Al), aluminum copper (AlCu), molybdenum (Mo), tungsten (W), platinum (Pt), tantalum nitride (TaN), tantalum carbide (TaC), WN, $Mo_2N$, WN, TiAlN, TaAlN, niobium (Nb), iridium (Ir), osmium (Os), ruthenium (Ru), the like, or a combination thereof. In one specific embodiment, the first source/drain conductive layer 108 is formed of Ti, the second source/drain conductive layer 110 is formed of Al or AlCu, the third source/drain conductive layer 112 is formed of Ti, and the fourth source/drain conductive layer 114 is formed of TiN. In some embodiments, the source/drain conductive layers 108, 110, 112, and 114 are formed by physical vapor deposition (PVD), CVD, ALD, sputter deposition, the like, or a combination thereof.

The source/drain conductive layers 108, 110, 112, and 114 are then patterned to form the source/drain 130. In some embodiments, the source/drain conductive layers 108, 110, 112, and 114 are patterned by forming and patterning a photoresist (not shown) over the fourth source/drain conductive layer 114 and performing a reactive ion etch (RIE) to remove the exposed portions of the source/drain conductive layers 108, 110, 112, and 114 down to the cap layer 106. In an embodiment, an upper portion of the cap layer 106 is removed in the patterning of the source/drain conductive layers 108, 110, 112, and 114.

Although FIG. 1 illustrates a source/drain 130 with four conductive layers, more or less conductive layers are within the contemplated scope of the present disclosure. Even though only one source/drain 130 is shown in FIG. 1, there may be another source/drain 130 on the barrier layer 104, with an identical structure to the source/drain 130 shown, on the other side of the gate electrode 132.

After the source/drain 130 is formed, the ESL 116 is formed over the source/drain 130 and over cap layer 106. The ESL 116 is formed of oxynitride, SiC, SiON, oxide, combinations thereof, or the like. In some embodiments the ESL 116 is formed CVD, plasma enhanced CVD (PECVD), LPCVD, ALD, sputter, the like, or a combination thereof. The formation of the gate electrode 132 is described below with reference to FIGS. 2A through 2G.

Figure 2A:
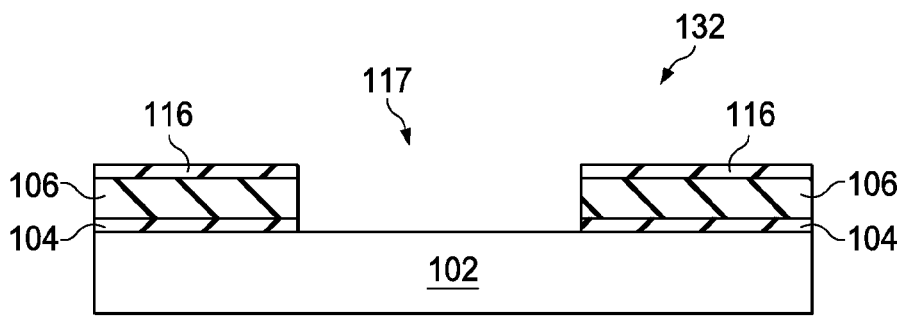
Figure 2B:
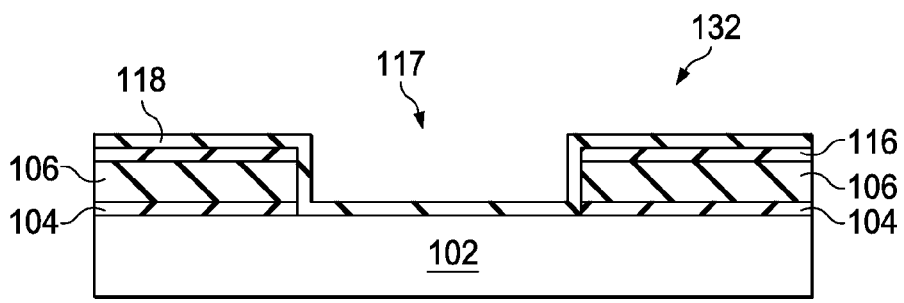
Figure 2C:
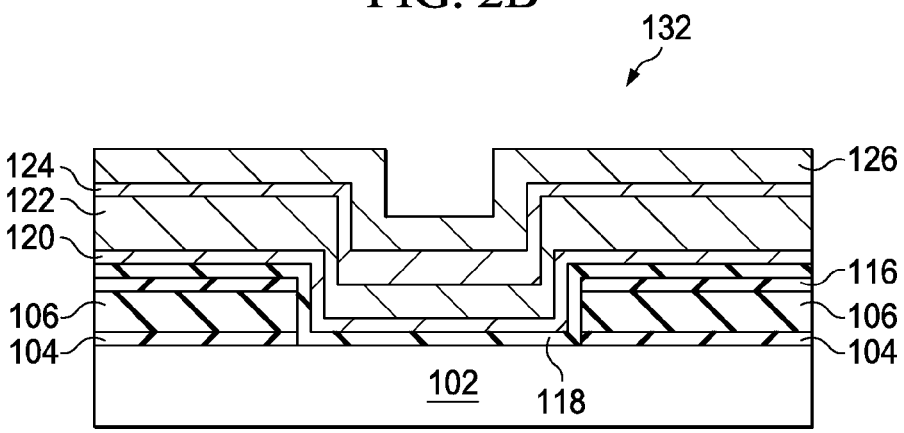
Figure 2D:
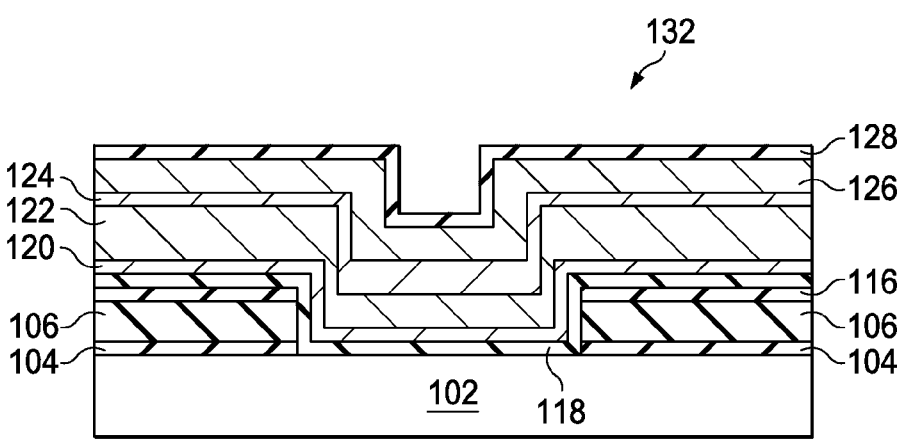
Figure 2G:
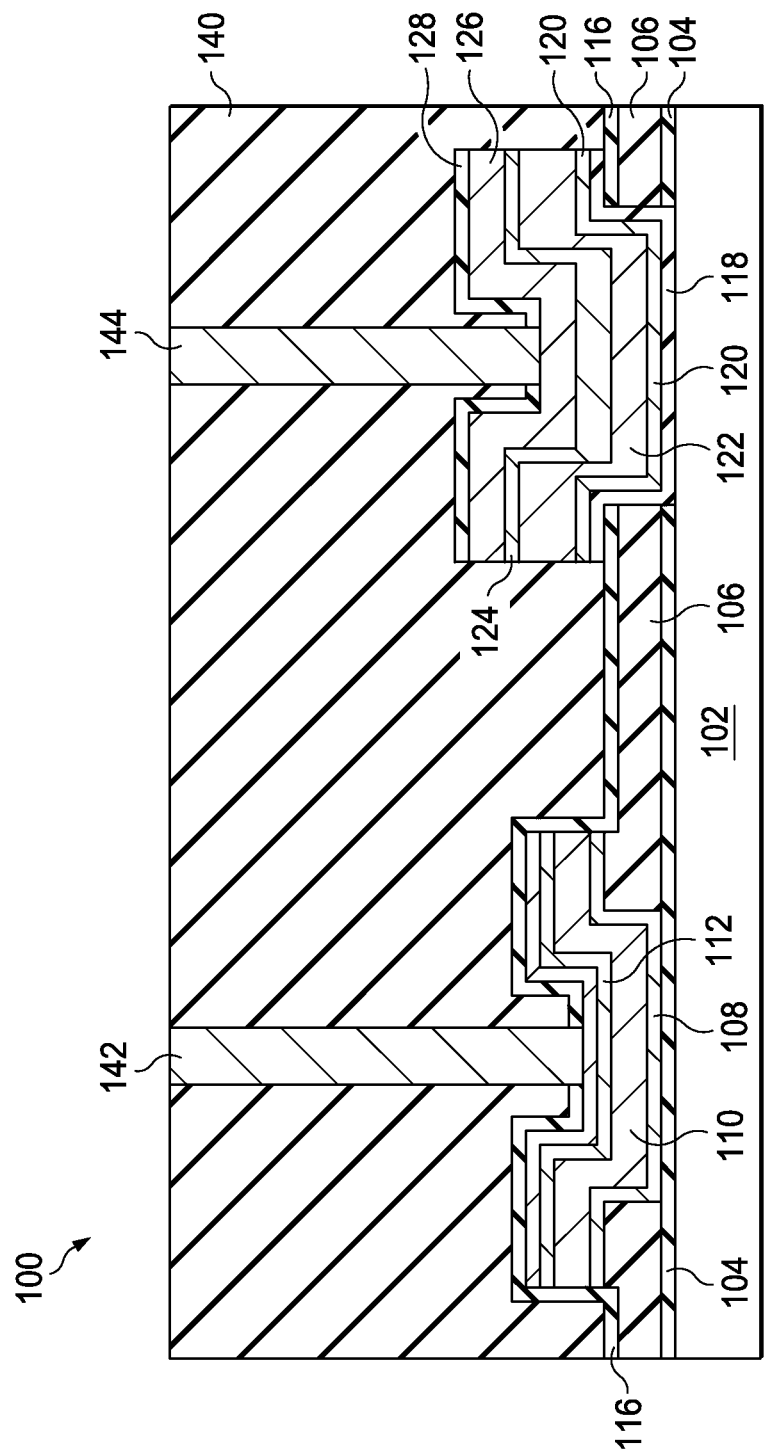
Figure 3:
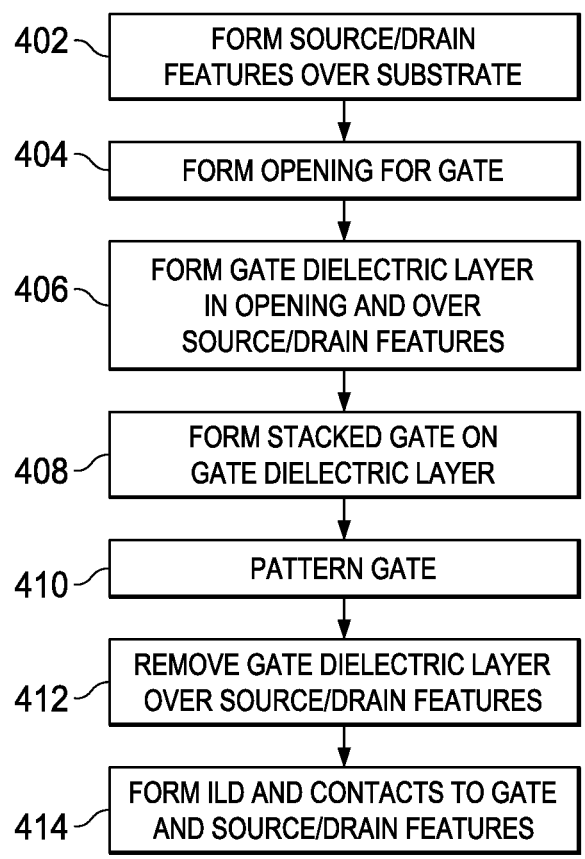
FIG. 3 illustrates a process flow of the process illustrated in FIGS. 2A through 2G according to an embodiment.

FIGS. 2A through 2G illustrate cross-sectional views of intermediate stages in the manufacturing of a semiconductor device according to an embodiment, and FIG. 3 is a process flow of the process shown in FIGS. 2A through 2G.

FIG. 2A illustrates the gate electrode 132 portion of MIS-FET 100 after the source/drain feature 130 has been formed (step 402) as described above. FIG. 2A illustrates an opening 117 formed through the barrier layer 104, the cap layer 106, and the ESL 116 to the substrate 102 (step 404). In some embodiments, the opening 117 is formed through the ESL 116, the cap layer 106, and the barrier layer 104 by forming and patterning a photoresist (not shown) over the ESL 116 and performing an etch process to remove the exposed portions of the ESL 116, the cap layer 106, and the barrier layer 104 down to the substrate 102.

FIG. 2B illustrates the formation of a gate dielectric layer 118 in the opening 117 (step 406) and over the ESL 116 including over the source/drain 130 (see FIG. 2E). In some embodiments, a sidewall of the gate dielectric layer 118 directly contacts sidewalls of the barrier layer 104, the cap layer 106, and the ESL 116 in the opening 117. The gate dielectric layer 118 may be formed by ALD, CVD, thermal oxidation, sputtering, the like, or a combination thereof. In some embodiments, the gate dielectric layer 118 includes dielectric materials having a high dielectric constant (k value), for example, greater than 3.9. In an embodiment, the gate dielectric layer 118 is formed of metal oxides such as $Al_2O_3$, $HfO_2$, $HfZrO_x$, $HfSiO_x$, $HfTiO_x$, $HfAlO_x$, or silicon nitrides, oxynitrides, the like, or combinations and multi-layers thereof.

FIG. 2C illustrates the formation of the stacked gate conductive layers 120, 122, 124, and 126 in the opening 117 and over the gate dielectric layer 118 (step 408). The first gate conductive layer 120 is formed in the opening 117 and over the gate dielectric layer 118. The second gate conductive layer 122 is formed on the first gate conductive layer 120, the third gate conductive layer 124 is formed on the second gate conductive layer 122, and the fourth gate conductive layer 126 is formed on the third gate conductive layer 124. The gate conductive layers 120, 122, 124, and 126 are formed of Ti, TiN, Al, Mo, W, Pt, TaN, TaC, WN, $Mo_2N$, WN, TiAlN, TaAlN, Nb, Ir, Os, Ru, the like, or a combination thereof. In one specific embodiment, the first gate conductive layer 120 is formed of TiN, the second gate conductive layer 122 is formed of Al, the third gate conductive layer 124 is formed of Ti, and the fourth gate conductive layer 126 is formed of TiN. In some embodiments, the gate conductive layers 120, 122, 124, and 126 are formed by PVD, CVD, ALD, sputter deposition, the like, or a combination thereof. Although FIG. 2C illustrates a gate electrode 132 with four conductive layers, more or less conductive layers are within the contemplated scope of the present disclosure.

FIG. 2D illustrates forming the ESL 128 over the gate conductive layers 120, 122, 124, and 126. The ESL 128 is formed of similar materials and by similar processes as the ESL 116 described above and the description is not repeated herein, although the ESL 116 and the ESL 128 need not be the same. In an embodiment, the ESL 116 and the ESL 128 have a same material composition. By having a same material composition for ESLs 116 and 128, the process window for etching contacts (e.g. contacts 142 and 144 in FIG. 2G) to the source/drain 130 and the gate electrode 132 is enlarged. The enlarged contact etch process window will improve the yield of the MISFET 100 as the ESL 128 protects the top conductive layer 126 of the gate electrode 132 from damage by contact etch process.

FIG. 2E illustrates patterning the gate conductive layers 120, 122, 124, and 126 to form a stacked gate electrode 132 (step 410). In some embodiments, the gate conductive layers 120, 122, 124, and 126 are patterned by forming and patterning a photoresist (not shown) over the fourth gate conductive layer 126 and performing an RIE to remove the exposed portions of the gate conductive layers 120, 122, 124, and 126 down to the gate dielectric layer 118.

FIG. 2F illustrates the removal of the gate dielectric layer 118 from over the source/drain region 130 (step 412). In some embodiments, the gate dielectric layer 118 is removed by forming and patterning a photoresist (not shown) over the gate electrode 132 and performing an etch process to remove the exposed portions of the gate dielectric layer 118 down to the ESL 116. In an embodiment, the same photoresist from patterning the gate electrode 132 (step 410) is used for removing the gate dielectric layer 118 from over the source/drain 130 (step 412). By removing the gate dielectric layer 118 from over the source/drain 130, the etch process for forming the contacts (e.g. contacts 142 and 144 in FIG. 2G) to each of the source/drain 130 and the gate electrode 132 stops on a layer with a similar if not a same material composition. Whereas, if the gate dielectric layer 118 was left over the source/drain 130, the etch process for the contact to the gate electrode 132 may etch through the ESL 128 and damage one or more of the top conductive layers of the gate electrode 132 and cause resistance capacitance failure of the gate electrode 132 because the gate dielectric layer 118 has a slower etch rate than the ESL 128.

FIG. 2G illustrates the formation of an inter-layer dielectric (ILD) 140 over the source/drain 130 and the gate electrode 132 and the formation of contacts 142 and 144 through the ILD 140 to the source/drain 130 and the gate electrode 132, respectively (step 414). The ILD 140 is be formed of oxides such as silicon oxide, borophosphosilicate glass (BPSG), undoped silicate glass (USG), fluorinated silicate glass (FSG), low-k dielectrics such as carbon doped oxides, extremely low-k dielectrics such as porous carbon doped silicon dioxide, a polymer such as polyimide, the like, or a combination thereof. The low-k dielectric materials may have k values lower than 3.9. The ILD 140 may be deposited by CVD, PVD, ALD, a spin-on-dielectric (SOD) process, the like, or a combination thereof. In an embodiment, the ILD 140 is formed directly on top surfaces of the ESL 116 and the ESL 128. In some embodiments, the ILD 140 is planarized by a chemical mechanical polish (CMP) process or an etching process to form a substantially planar top surface of the ILD 140.

After the ILD 140 is formed, openings (not shown) are formed through ILD 140 to form the contacts 142 and 144. In an embodiment, the openings are formed through the ILD 140 and through the ESL 116 and the ESL 128 to expose portions of the top source/drain conductive layer (fourth source/drain conductive layer 114 in FIG. 2G) and the top gate conductive layer (fourth gate conductive layer 126 in FIG. 2G). The openings are formed by laser drilling, an etch process, the like, or a combination thereof. After the openings are formed, a conductive material may be formed in the openings to form the contacts 142 and 144 which directly contact the top source/drain conductive layer (fourth source/drain conductive layer 114 in FIG. 2G) and the top gate conductive layer (fourth gate conductive layer 126 in FIG. 2G), respectively. In an embodiment, the conductive material is formed in the openings and along the top surface of the ILD 140 and subsequently recessed and/or planarized to form the contacts 142 and 144 by a CMP and/or etching process. In some embodiments, the openings are lined with a barrier layer (not shown) before being filled with the conductive material. The barrier layer helps to block diffusion of the subsequently formed contacts 142 and 144 into adjacent dielectric materials such as ILD 140. The barrier layer may be made of titanium, titanium nitride, tantalum, tantalum nitride, manganese, manganese oxide, cobalt, cobalt oxide, cobalt nitride, nickel, nickel oxide, nickel nitride, silicon carbide, oxygen doped silicon carbide, nitrogen doped silicon carbide, silicon nitride, aluminum oxide, aluminum nitride, aluminum oxynitride, a polymer such as polyimide, polybenzoxazole (PBO) the like, or a combination thereof. The barrier layer may be formed by CVD, PVD, PECVD, ALD, SOD, the like, or a combination thereof. In some embodiments, the barrier layer is omitted.

The conductive material of the contacts 142 and 144 is made of tungsten, copper, aluminum, the like, or a combination thereof. The contacts 142 and 144 may be formed through a deposition process such as electrochemical plating, PVD, CVD, the like, or a combination thereof. In some embodiments, the conductive material of the contacts 142 and 144 is formed on a seed layer, such as a titanium copper alloy.

By having a same material composition for ESLs over the source/drains and the gate electrode, the process window for etching contacts to the source/drains and the gate electrode is enlarged. The enlarged contact etch process window will improve the yield of the semiconductor device the ESL over the gate electrode protects the top conductive layer of the gate electrode from damage by contact etch process. Whereas, if the gate dielectric layer was left over the source/drains, the etch process for the contact to the gate electrode may etch through the ESL over the gate electrode and damage one or more of the top conductive layers of the gate electrode and cause resistance capacitance failure of the gate electrode because the gate dielectric layer has a slower etch rate than the ESL over the gate electrode. Further, the gate dielectric layer may be removed from over the source/drains without requiring an extra mask as the same mask used form patterning the gate electrode may be reused for removing the gate dielectric layer from over the source/drains.

An embodiment is a method for forming a semiconductor device, the method including forming a source/drain over a substrate, forming a first etch stop layer on the source/drain, and forming a gate dielectric layer on the first etch stop layer and along the substrate. The method further includes forming a gate electrode on the gate dielectric layer, forming a second etch stop layer on the gate electrode, and removing the gate dielectric layer from over the source/drain.

Another embodiment is a method of forming a metal-insulator-semiconductor field effect transistor (MISFET) device, the method including forming a barrier layer over the substrate, forming cap layer on the barrier layer, forming a source/drain on the barrier layer, and forming a first etch stop layer on the source/drain and along the cap layer. The method further includes forming a first opening through the first etch stop layer, the cap layer, and the barrier layer to expose a top surface of the substrate, forming a gate dielectric layer over first etch stop layer and in the first opening, and forming a stacked gate electrode in the first opening.

A further embodiment is a metal-insulator-semiconductor field effect transistor (MISFET) device including a barrier layer on a substrate, a source/drain on the barrier layer, and a first etch stop layer on the source/drain. The MISFET device further includes a gate dielectric layer on the substrate, a sidewall of the gate dielectric layer adjoining a sidewall of the barrier layer, a portion of the gate dielectric layer overlapping a portion of the first etch stop layer, and a gate electrode on the gate dielectric layer.

Although the present embodiments and their advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for forming a semiconductor device, the method comprising:
   forming a barrier layer over a substrate;
   forming a source/drain over and in direct contact with the barrier layer;
   forming a first etch stop layer on the source/drain;
   forming a gate dielectric layer on the first etch stop layer and along the substrate;
   forming a gate electrode on the gate dielectric layer;
   forming a second etch stop layer on the gate electrode;
   removing the gate dielectric layer from over the source/drain;
   forming an inter-layer dielectric over the source/drain, the gate electrode, and the substrate;
   forming a first opening through the inter-layer dielectric and the first etch stop layer to expose a portion the source/drain;
   forming a second opening through the inter-layer dielectric and the second etch stop layer to expose a portion of the gate electrode; and
   filling the first and second openings with a conductive material to form a first contact and a second contact, the first contact contacting the first etch stop layer and the source/drain, the second contact contacting the second etch stop layer and the gate electrode.

2. The method of claim 1 further comprising: a sidewall of the gate dielectric layer adjoining a sidewall of the barrier layer.

3. The method of claim 2 further comprising:
   forming a cap layer on the barrier layer, the first etch stop layer extending along the cap layer;
   forming a first opening through the cap layer to expose a portion of the barrier layer, the source/drain being formed in the first opening; and
   forming a second opening through the first etch stop layer, the cap layer, and the barrier layer to expose a portion the substrate, the gate electrode being formed in the second opening.

4. The method of claim 1, wherein forming the gate electrode comprises:
   forming a plurality of conductive layers; and
   patterning the plurality of conductive layers to expose the gate dielectric layer.

5. The method of claim 1, wherein forming the source/drain comprises:
   forming a plurality of conductive layers; and
   patterning the plurality of conductive layers.

6. The method of claim 1, wherein the first etch stop layer extends along a sidewall of the source/drain, and wherein a sidewall of the gate electrode adjoins the inter-layer dielectric.

7. The method of claim 1, wherein the first contact directly contacts the first etch stop layer and the source/drain.

8. A method of forming a metal-insulator-semiconductor field effect transistor (MISFET) device, the method comprising:
   forming a barrier layer over a substrate;
   forming cap layer on the barrier layer;
   forming a source/drain on the barrier layer;
   forming a first etch stop layer on the source/drain and along the cap layer;
   forming a first opening through the first etch stop layer, the cap layer, and the barrier layer to expose a top surface of the substrate;
   forming a gate dielectric layer over first etch stop layer and in the first opening, wherein the gate dielectric layer directly contacts the cap layer and the barrier layer; and
   forming a stacked gate electrode in the first opening.

9. The method of claim 8, wherein forming the barrier layer over the substrate comprises epitaxially growing a III-V compound layer on the substrate, and wherein forming the cap layer comprises depositing silicon nitride by a low pressure chemical vapor deposition process.

10. The method of claim 8 further comprising forming a second etch stop layer on the stacked gate electrode.

11. The method of claim 10, wherein the second etch stop layer has a same material composition as the first etch stop layer.

12. The method of claim 10 further comprising:
forming an inter-layer dielectric on the first etch stop layer and the second etch stop layer;
forming at least two openings in the inter-layer dielectric with at least one of the at least two openings extending through each of the first and second etch stop layers; and
filling the at least two openings with a conductive material forming at least two contacts in the at least two openings, at least one of the at least two contacts being coupled to each of the source/drain and the stacked gate electrode.

13. The method of claim 8, wherein the forming the stacked gate electrode comprises:
forming a stack of III-V layers on the gate dielectric layer in the first opening and along the first etch stop layer; and
etching the stack of III-V layers to expose portions of the gate dielectric layer.

14. The method of claim 13, wherein the stack of III-V layers comprises titanium, aluminum, titanium nitride, or a combination thereof.

15. A method for forming a semiconductor device, the method comprising:
forming a barrier layer over a substrate;
forming a source/drain feature directly contacting the barrier layer;
depositing a first etch stop layer on the source/drain feature;
etching a gate opening through the first etch stop layer to expose a portion of the substrate;
forming a gate dielectric layer over the first etch stop layer and along sidewalls and a bottom surface of the gate opening;
depositing a gate electrode layer on the gate dielectric layer over the first etch stop layer and in the gate opening;
forming a second etch stop layer on the gate electrode layer, the second etch stop layer being a dielectric;
patterning the second etch stop layer and the gate electrode layer to form a gate electrode, the patterning step exposing the gate dielectric layer; and
after the patterning the second etch stop layer and the gate electrode layer to form the gate electrode, removing the gate dielectric layer from over the source/drain feature to expose a portion of the first etch stop layer.

16. The method of claim 15 further comprising:
forming an inter-layer dielectric on the first etch stop layer and the second etch stop layer;
forming at least two openings in the inter-layer dielectric with at least one of the at least two openings extending through each of the first and second etch stop layers; and
filling the at least two openings with a conductive material forming at least two contacts in the at least two openings, at least one of the at least two contacts being coupled to each of the source/drain feature and the gate electrode.

17. The method of claim 15, wherein a sidewall of the gate dielectric layer adjoins a sidewall of the barrier layer.

18. The method of claim 17 further comprising:
forming a cap layer on the barrier layer, the first etch stop layer extending along the cap layer; and
forming a source/drain opening through the cap layer to expose a portion of the barrier layer, the source/drain feature being formed in the source/drain opening, the gate opening extending through the first etch stop layer, the cap layer, and the barrier layer to expose a portion the substrate.

19. The method of claim 18, wherein forming the barrier layer over the substrate comprises epitaxially growing a III-V compound layer on the substrate, and wherein forming the cap layer comprises depositing silicon nitride by a low pressure chemical vapor deposition process.

20. The method of claim 15, wherein the depositing the gate electrode layer on the gate dielectric layer further comprises forming a plurality of conductive layers, and wherein the forming the source/drain feature over a substrate further comprises forming a plurality of conductive layers.

* * * * *